(12) United States Patent
Chandra et al.

(10) Patent No.: US 9,109,279 B2
(45) Date of Patent: Aug. 18, 2015

(54) METHOD FOR COATING A BLADE AND BLADE OF A GAS TURBINE

(75) Inventors: Sharad Chandra, Oberhausen (DE); Norbert Czech, Dorsten (DE)

(73) Assignee: MAN Diesel & Turbo SE, Augsburg (DE)

( * ) Notice: Subject to any disclaimer, the term of this patent is extended or adjusted under 35 U.S.C. 154(b) by 2054 days.

(21) Appl. No.: 12/086,511

(22) PCT Filed: Dec. 12, 2006

(86) PCT No.: PCT/EP2006/011943
§ 371 (c)(1), (2), (4) Date: Aug. 7, 2008

(87) PCT Pub. No.: WO2007/101465
PCT Pub. Date: Sep. 13, 2007

(65) Prior Publication Data
US 2010/0266409 A1    Oct. 21, 2010

(30) Foreign Application Priority Data
Dec. 14, 2005   (DE) .......................... 10 2005 060 243

(51) Int. Cl.
B32B 15/01 (2006.01)
C23C 10/14 (2006.01)
(Continued)

(52) U.S. Cl.
CPC ................. C23C 10/14 (2013.01); C23C 4/085 (2013.01); C23C 4/18 (2013.01); C23C 10/08 (2013.01);
(Continued)

(58) Field of Classification Search
USPC ......... 427/255.11, 255.19, 255, 419.2, 419.1; 428/472, 469, 680, 668, 547, 546
See application file for complete search history.

(56) References Cited

U.S. PATENT DOCUMENTS 4,087,589 A * 5/1978 Bessen .......................... 428/596
5,967,755 A * 10/1999 Czech et al. .............. 416/241 R
(Continued)

FOREIGN PATENT DOCUMENTS

EP   0 846 788    6/1998
EP   0 949 410    10/1999
(Continued)

OTHER PUBLICATIONS

Search Report dated May 4, 2007 issued for the underlying International Application No. PCT/EP2006/011943.

*Primary Examiner* — Mark Ruthkosky
*Assistant Examiner* — Daniel J Schleis
(74) *Attorney, Agent, or Firm* — Cozen O'Connor

(57) ABSTRACT

A method is provided for coating a hollow, internally cooled blade (1) of a gas turbine, in which method an outer coating (5) comprising an MCrAlY-based bonding layer (6) and a ceramic thermal barrier layer (9) of zirconium oxide is applied to the base material (3) of the blade (1) on the outer side of the blade (1) and an inner coating (4) comprising a Cr diffusion layer (7) is applied to the base material (3) of the blade (1) on the inner side of the blade (1). The MCrAlY-based bonding layer (6) is thereby applied to the finished blade (1). At the same time, along with the inner coating (4), the Cr diffusion layer (7) is also applied to the MCrAlY-based bonding layer (6) of the outer coating (5) by chemical vapor deposition. Subsequently, an Al diffusion layer (8) and an outer brittle Al build-up layer are applied by chemical vapor deposition to the bonding layer (6) coated with the Cr diffusion layer (7). After that, the outer brittle Al build-up layer is removed by an abrasive treatment and the ceramic thermal barrier layer (9) is applied to the Al diffusion layer (8).

5 Claims, 2 Drawing Sheets

(51) Int. Cl.
  *C23C 4/08*    (2006.01)
  *C23C 4/18*    (2006.01)
  *C23C 10/08*   (2006.01)
  *C23C 10/60*   (2006.01)
  *C23C 14/02*   (2006.01)
  *C23C 14/08*   (2006.01)
  *C23C 14/30*   (2006.01)
  *C23C 30/00*   (2006.01)
  *F01D 5/18*    (2006.01)
  *C23C 28/00*   (2006.01)
  *F01D 5/28*    (2006.01)

(52) U.S. Cl.
  CPC .............. *C23C 10/60* (2013.01); *C23C 14/025* (2013.01); *C23C 14/028* (2013.01); *C23C 14/083* (2013.01); *C23C 14/30* (2013.01); *C23C 28/322* (2013.01); *C23C 28/325* (2013.01); *C23C 28/3215* (2013.01); *C23C 28/3455* (2013.01); *C23C 30/00* (2013.01); *F01D 5/187* (2013.01); *F01D 5/288* (2013.01); *F05D 2230/312* (2013.01); *F05D 2300/132* (2013.01); *F05D 2300/21* (2013.01)

(56) References Cited

U.S. PATENT DOCUMENTS

| | | |
|---|---|---|
| 6,139,976 A | 10/2000 | Czech et al. |
| 6,226,978 B1 | 5/2001 | Chandra et al. |
| 6,575,817 B2 | 6/2003 | Czech et al. |
| 2006/0177582 A1 | 8/2006 | Chandra et al. |
| 2007/0264126 A1 | 11/2007 | Box et al. |
| 2008/0057189 A1 | 3/2008 | Smith et al. |

FOREIGN PATENT DOCUMENTS

| | | |
|---|---|---|
| EP | 1 637 622 | 3/2006 |
| WO | WO 97/05299 | 2/1997 |
| WO | WO 00/17417 | 3/2000 |
| WO | WO 2005/106064 | 11/2005 |
| WO | WO 2006/061431 | 6/2006 |

\* cited by examiner

METHOD FOR COATING A BLADE AND BLADE OF A GAS TURBINE

CROSS REFERENCE TO RELATED APPLICATIONS

This is a U.S. national stage of International Application No. PCT/EP2006/011943, filed on 12 Dec. 2006. Priority is claimed on German Application No. 10 2005 060 243.6, filed on 14 Dec. 2005.

BACKGROUND OF THE INVENTION

1. Field of the Invention

The invention relates to protective coatings for blade and, more particularly, to a method for coating a hollow, internally cooled blade of a gas turbine and a blade of this type for a gas turbine.

2. Description of the Related Art

In modern gas turbines, almost all surfaces in the hot-gas section are provided with coatings to protect them from high-temperature oxidation and high-temperature corrosion. An exception to the foregoing, however, is the case in which the turbine blades are located in the rear of a blade array. Chromium oxide-forming and aluminum oxide-forming diffusion layers and cladding layers have become widely adopted for such applications. In the latter case, MCrAlY cladding layers (M=Ni, Co) are the type of cladding most widely used in stationary gas turbines.

Simultaneously, cooled blades (i.e., hollow blades) are being produced to an increasing extent to keep the material temperature to a level that the available materials can withstand. Cooling is usually accomplished with compressed air, which, depending on the pressure in the environment of the blades to be cooled, is obtained from certain stages of the compressor of the gas turbine system. The temperature of the cooling air is between approximately 450° C. at the inlet to the blade and approximately 800° C. at the outlet from the blade. In the case of highly stressed cooled blades, internal coatings are being used to an increasing extent to prevent oxidation-caused attacks on the grain boundaries, which can have the effect of initiating cracks. Through the use of internal coatings in blades, the thermomechanical fatigue (TMF) life can be considerably extended.

For reasons of process technology, Al diffusion layers produced by alitization have therefore been used almost exclusively. The disadvantage of an Al diffusion layer as an internal coating is that the Al diffusion layer is brittle and has a relatively low resistance to the sources of high-temperature corrosion, which can be present as contaminants in the cooling air. It is also known that Cr diffusion layers produced by chromizing can be used to protect against high-temperature oxidation and corrosion.

In addition, heat insulating layer systems are used on cooled components, such as the blades of gas turbines. Heat-insulating layer systems in gas turbines always consist of a metallic bonding layer diffusion bonded to the base material, on top of which a ceramic layer with poor thermal conductivity is applied, which represents the actual barrier against the heat flow.

In principle, either diffusion layers or cladding layers of the MCrAlY type can be used as bonding layers. The most important property of the bonding layers is the ability to form the purest possible aluminum oxide on its surface, as a result of which the cyclical and static bonding of the heat insulating layer system is ensured.

MCrAlY layers contain the intermetallic β-phase NiCoAl as an aluminum reserve in a NiCoCr ("γ") matrix. The β-phase NiCoAl, however, also has an embrittling effect. As a result, the Al content which can be realized in practice is ≤12 wt. %. To achieve a further increase in the oxidation resistance, it is possible to coat the MCrAlY layers with an Al diffusion layer by alitization. Because of the danger of embrittlement, this is limited in most cases to starting layers with a relatively low aluminum content.

To increase the Al content in the MCrAlY layer, it is proposed in German Patent Application 10 2004 045 049.8 to continue the alitizing until an Al diffusion layer with an Al content of approximately 20% and on top of that a built-up Al layer of approximately 30% has been produced (by further alitization). The built-up Al layer contains the very brittle β-NiAl phase. By means of an abrasive treatment, e.g., by blasting with hard particles, the outer built-up Al layer is removed down to the Al diffusion layer, as a result of which the Al content in the remaining diffusion layer is at least 18% and no more than 30%.

SUMMARY OF THE INVENTION

It is an object of the invention to improve the method for coating a blade or a blade of a gas turbine such that the tendency of the internal coating to crack because of thermo-mechanical fatigue is reduced and the application of the outer coating to the blade is facilitated.

These and other objects and advantages are achieved in accordance with the invention by applying onto an outside surface of a base material of the blade an outer coating comprising a MCrAlY-based bonding layer; applying, by chemical vapor deposition, an inner coating consisting of a first Cr diffusion layer to an inside surface of the blade; applying a second Cr diffusion layer to the MCrAlY-based bonding layer of the outer coating, wherein the steps of applying the first Cr diffusion layer and applying the second Cr diffusion layer are performed simultaneously; applying an Al diffusion layer and an outer brittle built-up Al layer by chemical vapor deposition to the bonding layer coated with the second Cr diffusion layer; removing the outer brittle built-up Al layer by an abrasive treatment; and applying, after the step of removing, a ceramic heat-insulating layer of zirconium to the Al diffusion layer.

By replacing the alitized layer, which tends to be brittle, by a chromized layer as the internal coating, the more ductile Cr diffusion layer decreases the tendency for cracks to form and, thus, improves the "thermomechanical" fatigue life of the highly thermally stressed blades. In addition to the improved mechanical properties, a considerable increase in the resistance to high-temperature corrosion is also achieved. In the case of the sulfur-contaminated cooling air, an increase in the resistance to high-temperature corrosion is important in the operating temperature range of the internal coating. Furthermore, an advantage in terms of process technology is achieved because the alitization of the MCrAlY outer coating is made easier by the chromium enrichment at the surface achieved by the internal coating method. Moreover, the duration of the alitization method can also be reduced.

BRIEF DESCRIPTION OF THE DRAWINGS

The invention is explained in more detail below using an exemplary embodiment with reference to the drawings, in which.

DETAILED DESCRIPTION OF THE EXEMPLARY EMBODIMENTS

Figure 1:
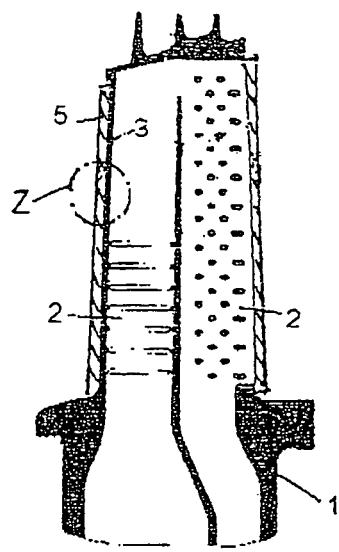
FIG. 1 shows a longitudinal section through a gas turbine blade.
Figure 2:
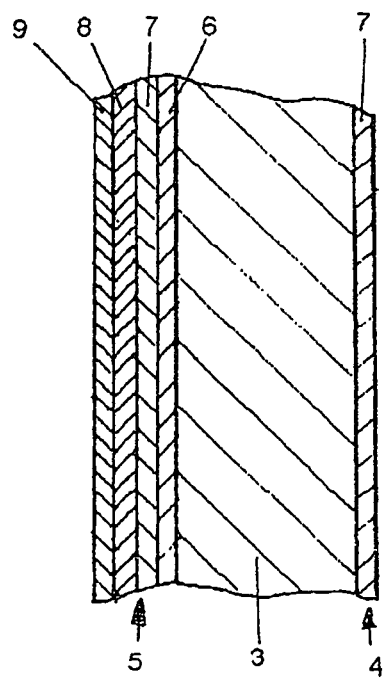
FIG. 2 shows detail Z of FIG. 1, not true to scale.
Figure 3:
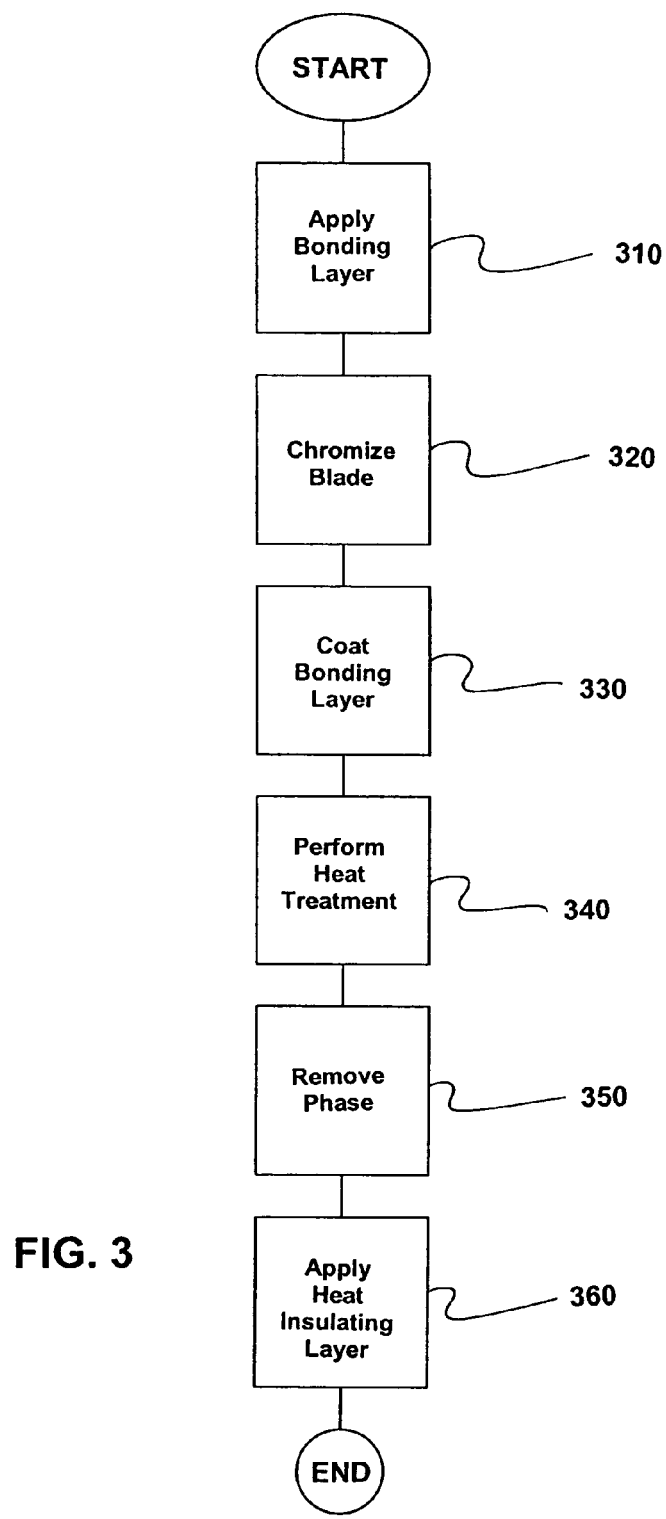
FIG. 3 is a flow chart of the method in accordance with the invention.

The wall of the blade 1 consists of a base material 3 of a highly heat-resistant nickel or cobalt based alloy. The base material 3 is provided on the inner side, i.e., on the side facing the cooling channels 2, with an inner coating 4 and on the outside of the blade with an outer coating 5, the production of which is described in the following with respect to FIGS. 1-3.

The starting state for the production of the coating is the finish-machined blade 1. In a first step 310, a bonding layer 6 of a MCrAlY alloy is applied to the outside of the blade 1 to serve as the bottom layer of the outer coating 5. Application is performed by the low-pressure plasma spraying (LPPS) process or by the high-velocity oxygen fuel (HVOF) thermal spray process. As a result, a high-density, high-quality layer is obtained.

In the second step 320 the entire blade 1 is chromized by chemical vapor deposition (CVD). Here, a hot, reactive Cr-containing gas is brought into contact with the blade 1. At elevated temperature, this gas causes the inward-diffusion of Cr into the base material 3 and the MCrAlY bonding layer 6, as well as an outward diffusion of Ni. During this step, a Cr diffusion layer 7 forms as an intermediate layer on the bonding layer 6 of the outer coating 5 and another Cr diffusion layer forms simultaneously as an internal coating 4.

In the third step 330, the bonding layer 6 coated with the Cr diffusion layer 7 is subjected to alitization by chemical vapor deposition, in that the bonding layer 6 is exposed to a hot, reactive Al-containing gas. In this variant of further alitization, as described in the previously mentioned German Patent Application 10 2004 045 049.8, a built-up Al layer 8 is produced on top of the Al diffusion layer itself, this built-up layer containing the very brittle β-NiAl phase.

To optimize the material properties of the base material 3, the fourth step 340 is preferably a heat treatment of the blade 1 in the form of a solution treatment followed by age-hardening.

In the fifth step 350 as described in the previously cited German Patent Application 10 2004 045 049.8, the very brittle β-NiAl phase is removed by an abrasive treatment, e.g., by blasting with hard particles, so that only the actual Al diffusion layer 8 remains behind.

In the sixth 360 step, a heat-insulating layer 9 is then applied to the chromized and alitized MCrAlY bonding layer 6 by electron beam-physical vapor deposition (EB-PVD). The heat-insulating layer 9 consists of zirconium oxide, partially stabilized with approximately 7% yttrium oxide.

Aside from the method of further alitization, the individual coating processes cited above are generally known in coating technology. Consequently, there is no need to describe these steps in detail. Performing the individual method steps correctly, however, is crucial to the success of the inventive method.

Thus, while there are shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. Moreover, it should be recognized that structures shown and/or described in connection with any disclosed form or embodiment of the invention may be incorporated in any other disclosed or described or suggested form or embodiment as a general matter of design choice.

What is claimed is:

1. A method for coating a hollow, internally cooled blade of a gas turbine, comprising:
    applying onto an outside surface of a base material of the blade an outer coating comprising a MCrAlY-based bonding layer;
    applying, by chemical vapor deposition, an inner coating consisting of a first Cr diffusion layer to an inside surface of the blade;
    applying a second Cr diffusion layer to the MCrAlY-based bonding layer of the outer coating, wherein the steps of applying the first Cr diffusion layer and applying the second Cr diffusion layer are performed simultaneously;
    applying an Al diffusion layer and an outer brittle built-up Al layer by chemical vapor deposition to the bonding layer coated with the second Cr diffusion layer;
    removing the outer brittle built-up Al layer by an abrasive treatment; and
    applying, after the step of removing, a ceramic heat-insulating layer of zirconium to the Al diffusion layer.

2. The method according to claim 1, further comprising:
    subjecting the blade to a solution heat treatment before removing the outer brittle built-up Al layer by the abrasive treatment abrasive.

3. The method according to claim 1, wherein the bonding layer is applied as a cladding layer by plasma or high-velocity spraying.

4. The method according to claim 2, wherein the bonding layer is applied as a cladding layer by plasma or high-velocity spraying.

5. A hollow, cooled blade of a gas turbine, comprising:
    an outer coating comprising a MCrAlY-based bonding layer and a ceramic heat-insulating layer of zirconium oxide applied to an outside surface of the blade on a base material of the blade;
    an inner coating consisting of a first Cr diffusion layer applied to an inside surface of the blade; and
    a second Cr diffusion layer and an Al diffusion layer arranged in the outer coating;
    wherein the ceramic heat-insulating layer is applied to the MCrAlY-based bonding layer of the outer coating subsequent to removal of an outer brittle built-up layer by an abrasive treatment.

\* \* \* \* \*